(12) United States Patent
Park et al.

(10) Patent No.: US 6,268,640 B1
(45) Date of Patent: Jul. 31, 2001

(54) FORMING STEEP LATERAL DOPING DISTRIBUTION AT SOURCE/DRAIN JUNCTIONS

(75) Inventors: Heemyong Park, LaGrangeville; Yuan Taur, Bedford; Hsing-Jen C. Wann, Briarcliff Manor, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/373,161

(22) Filed: Aug. 12, 1999

(51) Int. Cl.⁷ ................................................. H01L 29/72
(52) U.S. Cl. ..................... 257/607; 257/288; 257/328; 257/335; 257/404; 257/408; 257/605; 257/616; 257/655; 438/162; 438/303; 438/305; 438/520; 438/525
(58) Field of Search ................................. 257/288, 335, 257/328, 404, 408, 655, 607, 616; 438/162, 303, 305, 520, 525

(56) References Cited

U.S. PATENT DOCUMENTS 5,223,445 * 6/1993 Fuse ...................................... 257/288

* cited by examiner

Primary Examiner—Edward Wojciechowicz
(74) Attorney, Agent, or Firm—Connolly Bove Lodge & Hutz; Joseph P. Abate

(57) ABSTRACT

A semiconductor device is fabricated by implanting into a semiconductor substrate non-doping ions at a tilt angle of at least about 10° to laterally extend preamorphization of the substrate portion and then implanting into the substrate dopants for providing source/drain extensions or halo doping or both.

29 Claims, 6 Drawing Sheets

(2 of 6 Drawing Sheet(s) Filed in Color)

FIG.5 METHOD OF FORMING STEEP LATERAL DOPING DISTRIBUTION AT SOURCE/DRAIN JUNCTIONS IN CMOS TECHNOLOGIES

FORMING STEEP LATERAL DOPING DISTRIBUTION AT SOURCE/DRAIN JUNCTIONS

DESCRIPTION

Technical Field

The present invention relates to a method for fabricating a semiconductor device and particularly a MOSFET exhibiting relatively steep lateral doping distribution at source/drain junctions. The present invention is especially advantageous in fabricating CMOS devices. The semiconductor devices of the present invention are fabricated by implanting silicon and/or germanium ions at a tilt angle along with wafer rotation in order to preamorphize the semiconductor substrate. Furthermore, the present invention relates to semiconductor devices obtained by the described fabrication technique.

BACKGROUND OF INVENTION

Field effect transistors (FETs) have become the dominant active device for very large scale integration (VLSI) and ultralarge scale integration (ULSI) applications in view of the high impedance, high density and low power characteristics of integrated circuit FETs.

The most common configuration of FET devices is the MOSFET which typically comprises source and drain regions in a semiconductor substrate at a first surface thereof and a gate region therebetween. The gate includes an insulator on the first substrate surface between the source and drain regions, with a gate electrode or contact on the insulator. A channel is present in the semiconductor substrate beneath the gate electrode, and the channel current is controlled by a voltage at the gate electrode.

More recently, in an effort to reduce the channelling during implantation of source/drain dopants in the vertical or depth direction, the substrate has been preamorphized by implanting ions perpendicular to the substrate in the desired locations. This has resulted in shallower junctions in the vertical direction which in turn improves the short channel characteristics of the device. However, as the junction depth has been scaled down to below for example about 30 nanometers, disadvantages occur due to the reduced junction depth. Such disadvantages include increased source/drain resistance (Rsd) and limitation of dopant activation by silicidation. Any advantages achieved by shallow junction formation are offset by these disadvantages.

It would therefore be desirable to achieve improved short channel characteristics such as threshold voltage (Vt) rolloff along with better scalability of MOSFETs and especially CMOS devices in ULSI circuit design without the prior art problems and disadvantages such as increased source/drain resistance.

SUMMARY OF INVENTION

The present invention makes it possible to achieve improved short channel characteristics including threshold voltage (Vt) rolloff along with better scalability. More particularly, the present invention makes it possible to provide steeper lateral doping profiles near the source/drain junctions of the MOSFET devices.

More particularly, the method of the present invention for fabricating a semiconductor device comprises providing a structure having a semiconductor substrate, gate insulating layer located above selected portions of the semiconductor substrate, gate conductor located above the gate insulating layer. Non-doping ions are implanted into the substrate. The non-doping ions include germanium and/or silicon. The non-doping ions are implanted at a tilt angle $\alpha$ of at least about 10° and at a dosage of at least about 1E14 cm$^{-2}$ at an energy of at least about 10 Kev. In addition, the edges of the gate conductor act as a self-aligned mask for implanting the non-doping ions. Dopants are then implanted into the substrate for providing source/drain extensions and/or halo doping.

The present invention also relates to semiconductor devices obtained by the above disclosed process.

The present invention also relates to semiconductor device which comprises a structure having a semiconductor substrate, gate insulating layer located above selected portions of the semiconductor substrate, gate conductor located above the gate insulating layer. The substrate further comprises non-doping ions having been implanted at a tilt angle $\alpha$ of at least about 10° and at a dosage of at least about 1E14 cm$^{-2}$ at an energy of at least about 10 Kev. The non-doping ions comprise germanium and/or silicon. The substrate also includes dopants for providing source/drain extensions and/or halo doping.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

In order to facilitate an understanding of the present invention, reference will be made to the figures. For instance, when the discussion of the fabricating steps of the present invention refers to a particular type of substrate and/or a particular type of dopant impurity, it is understood that the present invention is applicable to the opposite type without departing from the spirit of the present invention. For instance, when reference is made to a p-type silicon substrate as the semiconductor substrate and n-type impurities as diffused or implanted dopant impurities, it is understood that an n-type substrate and p-type diffused or implanted dopant impurities are likewise suitable. In addition, it is understood that when the discussion refers to n-type impurities, the process steps are applicable to p-type impurities and vice versa. Also, when reference is made to impurities of a "first type" and to impurities of a "second type", it is understood that the "first type" refers to n- or p-type impurities and "second type" refers to the opposite conductivity type. That is, if the "first type" is p, then the "second type" is n. If the "first type" is n, then the "second type" is p.

Also, the present invention is applicable to substrates other than silicon as known in the art. For instance, the present invention is likewise applicable to semiconductor substrates such as silicon-on-insulator (SOI) substrates, group III–V compound semiconductor substrates such as gallium arsenide, silicon carbide, and silicon germanium heterostructures. In addition, the terms "polysilicon" and "polycrystalline silicon" are used herein interchangeably as in the prior art.

Figure 6:
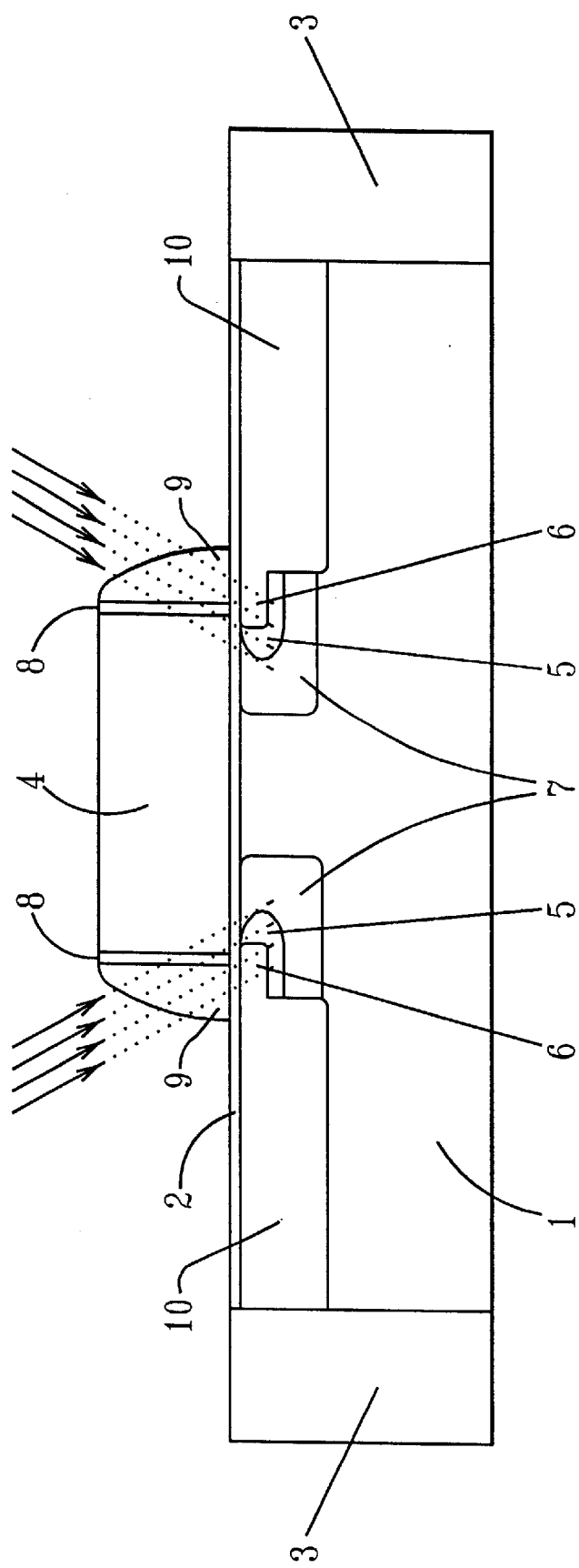
FIG. 6 is a cross-section of a MOSFET device according to the present invention.

FIG. 6 illustrates a semiconductor substrate 1 such as a silicon substrate. A dielectric layer 2 is provided on top of the semiconductor substrate 1. In addition, insulation wells 3 are formed in the substrate by well known techniques which need not be described herein. The gate can be provided, for instance, by depositing a layer of polycrystalline silicon by chemical vapor deposition followed by doping such as with an n-type dopant such as arsenic, phosphorus or antimony by any one of several techniques. A thick additional layer of silicon dioxide can be deposited on the polysilicon, such as by chemical vapor deposition. This serves as an etching mask to help delineate the polycrystalline material 4. The gate 4 can be delineated by well known techniques. For instance, a gate pattern determining layer such as a layer of resist material (not shown) of the type employed in known lithographic masking and etching techniques can be placed over the surface of the oxide. Any of the well known radiation sensitive polymerizable resist materials known in the art may be used. The resist material can be applied such as by spinning or by spraying.

After the layer of resist material is applied, it can then be selectively exposed for example to ultraviolet light radiation using a photolithographic mask. The mask would have transparent material having opaque portions in a predetermined pattern to define the gate. The mask wafer is then subjected to ultraviolet light which polymerizes the portion of the resist material underlying the transparent regions of the mask. The unexposed photoresist material and uncovered portions of the silicon dioxide are then removed, followed by removal of those portions of the polysilicon except for the desired gate region. Next, the remaining portions of the photoresist material and silicon dioxide material above the gate region is removed.

If desired, the top of the gate can then be subjected to reoxidation to provide a suitable capping on the gate. This tends to prevent out diffusion of dopants in the polysilicon and to insulate the polysilicon prior to the subsequent spacer formation and implantation.

Non-doping ions are implanted at a tilt angle α of about 10 to about 40°. Typical non-doping ions include Group IV elements such as germanium, silicon, carbon or other impurities such as nitrogen. The preferred non-doping ions include germanium and/or silicon. The non-doping ions are implanted at a dose of at least about 1E14 $cm^{-2}$ and preferably about 1E14 to about 1E15 $cm^{-2}$ and at an energy level of at least about 10 and preferably about 10–40 keV.

In addition, the substrate is rotated in order to achieve substantially equal distribution of the implanted non-doping ions. For example, the wafer can be rotated 90° after implanting one quarter (¼) of the total dose, and then implanting another quarter (¼) of the dose. The 90° quadrant rotation is repeated for a total of three times in order to complete implanting the total dose. Instead of rotating 90°, and implanting ¼ of the total dose in each quadrant, the wafer could be rotated by dividing the full 360° cycle by any whole number greater than 4 along with a corresponding reduction in the total dosage fraction used for each rotation. For example, the wafer could be rotated 45° after implanting one-eighth of the total dosage, and then implanting another eighth of the total dose. The 45° rotation would be repeated seven times.

According to the present invention, the edges of the conductive gate act as a self-aligned mask to direct the angled non-doping ion implantation to extend the amorphization region 5 underneath the gate edge. Accordingly, the gate conductor does not include thick sidewall spacers at this stage of the process since such would tend to preclude obtaining sharper lateral channel doping as achieved by the present invention.

The preamorphization achieved by the implants at a tilt angle according to the present invention reduces the lateral straggle (lateral channeling) of subsequently implanted dopants. The reduced lateral straggle of the source/drain extension dopant atoms leads to steeper p-n junction profiles. Advantages of utilizing steeper lateral profiles include better short channel characteristics including threshold voltage (Vt) rolloff and better scalability of devices such as CMOS devices in ULSI circuit design.

The steepness of the lateral profile depends upon the lateral extension of the amorphous layer. Based on vertical amorphization data, it can be laterally increased by 20% or more.

Figure 1:
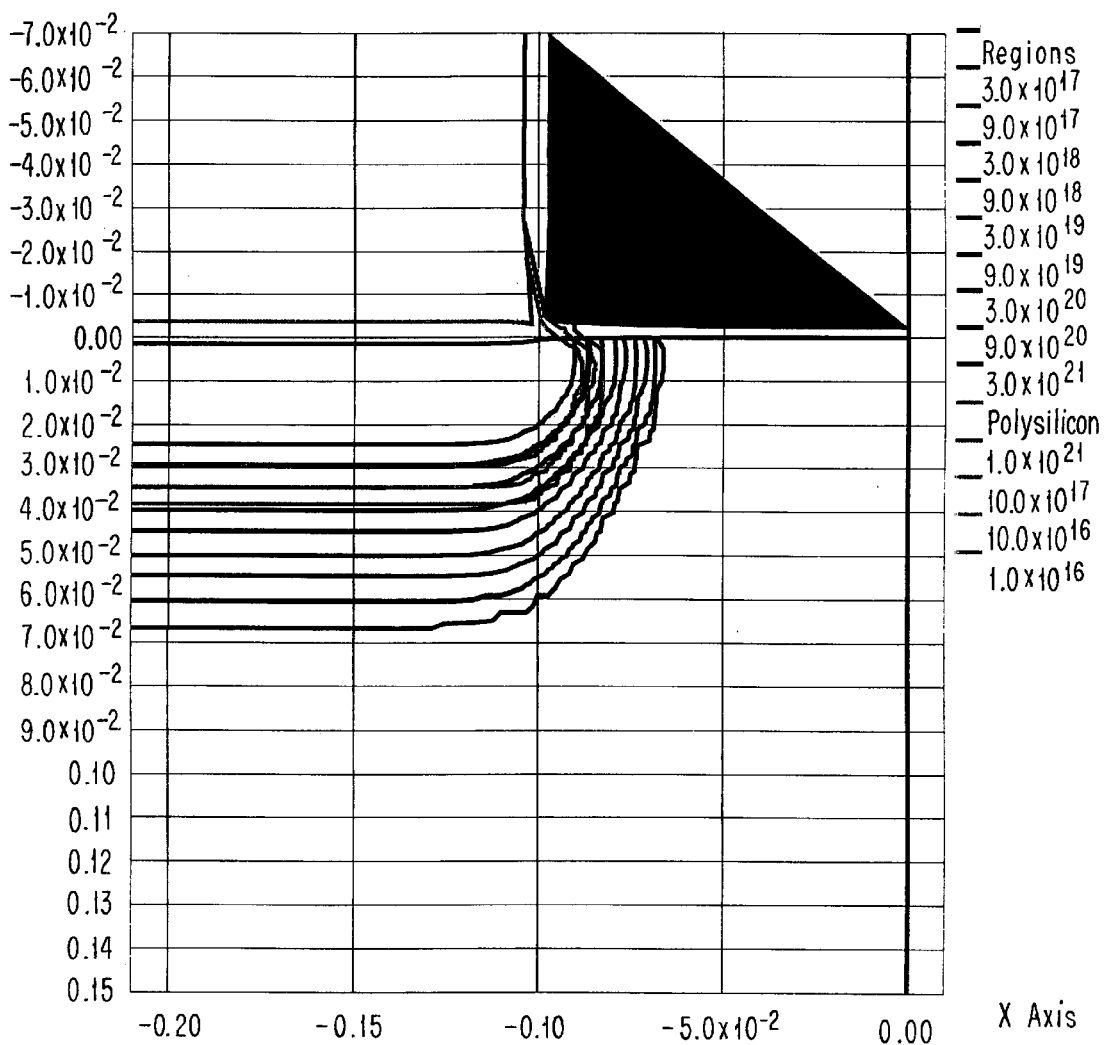
FIG. 1 illustrates the effect of preamorphizing implant at 0° tilt (perpendicular to the substrate) as carried out in the prior art.
Figure 2:
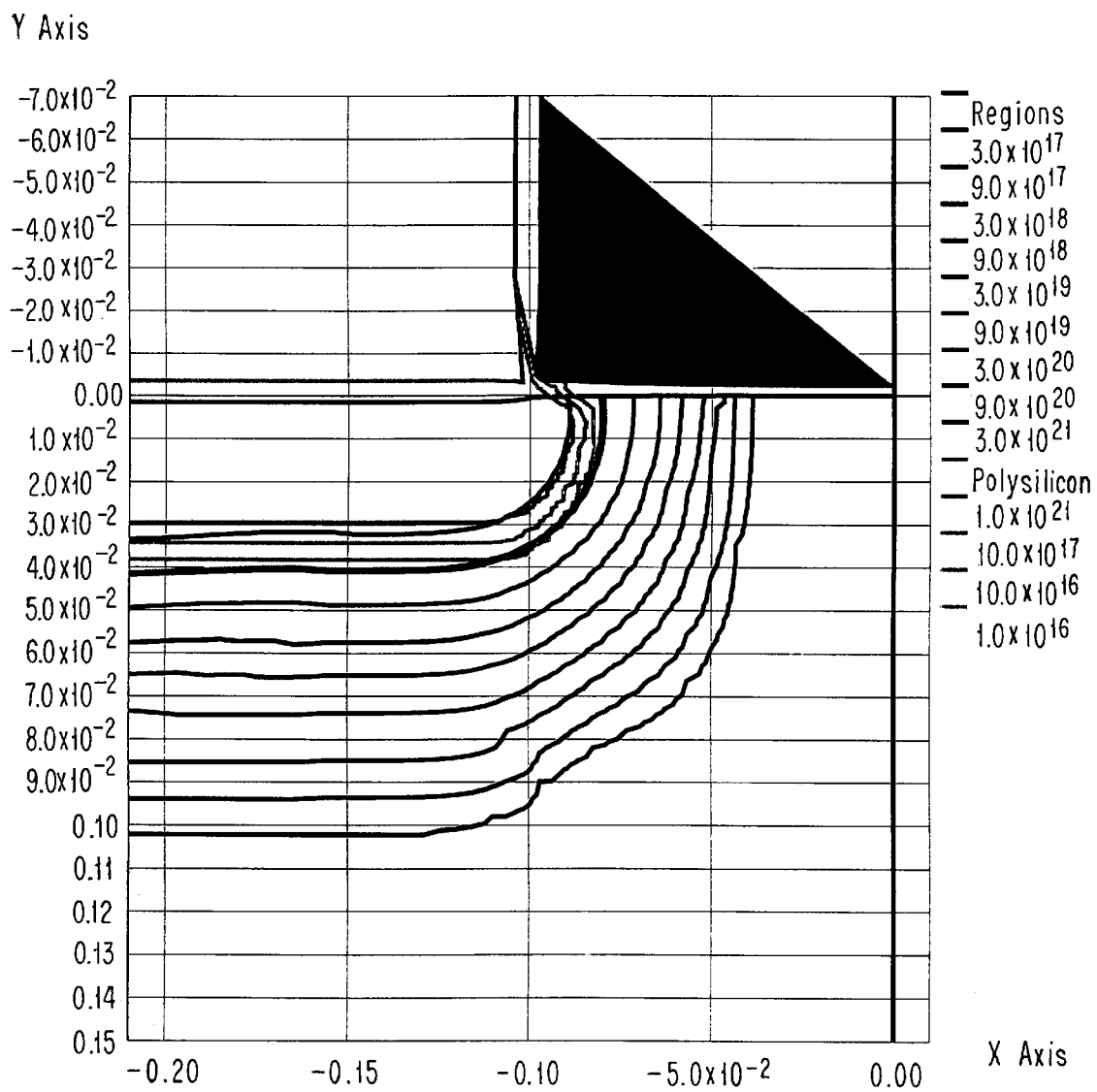
FIG. 2 illustrates the effect of the present invention in preamorphizing implantation employing a 30° tilt angle.

FIGS. 1 and 2 show simulations of the lateral extension of implant damage, indicating that the lateral extension of damage can be more than 300 Å underneath the gate oxide due to the process of the present invention.

The angled implantation of ions such as germanium and/or silicon extends more crystal damage towards the middle of the channel region beneath the gate oxide interface. Two-dimensional simulations of the implantation process as illustrated in FIGS. 1 and 2 demonstrate the effects of tilting the wafers along with a 90° rotation. The angled implantation was at about 30° and this is compared to 0° implantation. The dosages employed involve a 4-time implantation with a quarter of the total dose. Reference to FIGS. 1 and 2 show that the black lines denote the extent of implant damage and the red lines denote the expected amorphous/crystalline interface. The blue lines are the "target" dopant such as arsenic junction contours as n-extension and channel junction formation shown as a reference of comparison.

As shown, the damage due to the implantation of the germanium is more extended laterally into the channel region with the 30° tilt angle implant (see FIG. 2) than the conventional 0° implant (see FIG. 1). The crystal damage can then be annealed out by normal rapid temperature processing after the implants.

Since lateral straggle of dopants implanted after the germanium implantation is significantly affected by the crystal structure in the particular region, the net effect of the tilt angle is reduction of lateral spread of the extension dopant, which leads to enhanced short channel characteristics such as reduced Vt rolloff. More abrupt dopings in both sides of the source/drain junctions lead to less extent of charge sharing and depletion extension at a channel length as the device size is scaled down.

The preamorphizing as carried out by the present invention reduces the lateral straggle which governs the conduction in the device directly by modifying inversion/depletion regions in the channel.

Next, non-amortizing dopants are implanted to provide source/drain extension 6 and/or halo doping 7. N-type dopants for silicon include phosphorus and arsenic. P-type dopants for silicon include boron and indium.

Drain/source extension doping comprises non-amorphizing lightly doped or medium doped (LDD/MDD) implantation. Typically, the extension doping is carried out at a dose of at least 2E14 cm$^{-2}$. The energy of the implantation is typically less than about 15 keV.

Non-amorphizing halo doping in the channel is carried out typically employing a dose of dopant less than 2E15 and more typically at least about 5E12 cm$^{-2}$.

After the implantation, optionally, the structure can be thermally annealed at a temperature typically about 900 to about 1050° C. for about 5 seconds or less.

Next, sidewall spacers can be formed on the gate structures by well known techniques. Suitable sidewall spacers 8, 9 include silicon oxide, silicon nitride and combinations thereof. These can be formed by chemical vapor deposition.

Next, dopants for deep source/drain 10 can be implanted. The dopants are typically at a dose of at least about 3E15 cm$^{-2}$.

If desired, the structure can then be subjected to a rapid temperature processing such as employing temperatures of about 900 to about 1050° C. for about 5 seconds or less.

Next, if desired, the structure can be subjected to further conventional process such as silicidation of exposed silicon and polysilicon surfaces and then backend processing.

Figure 3:
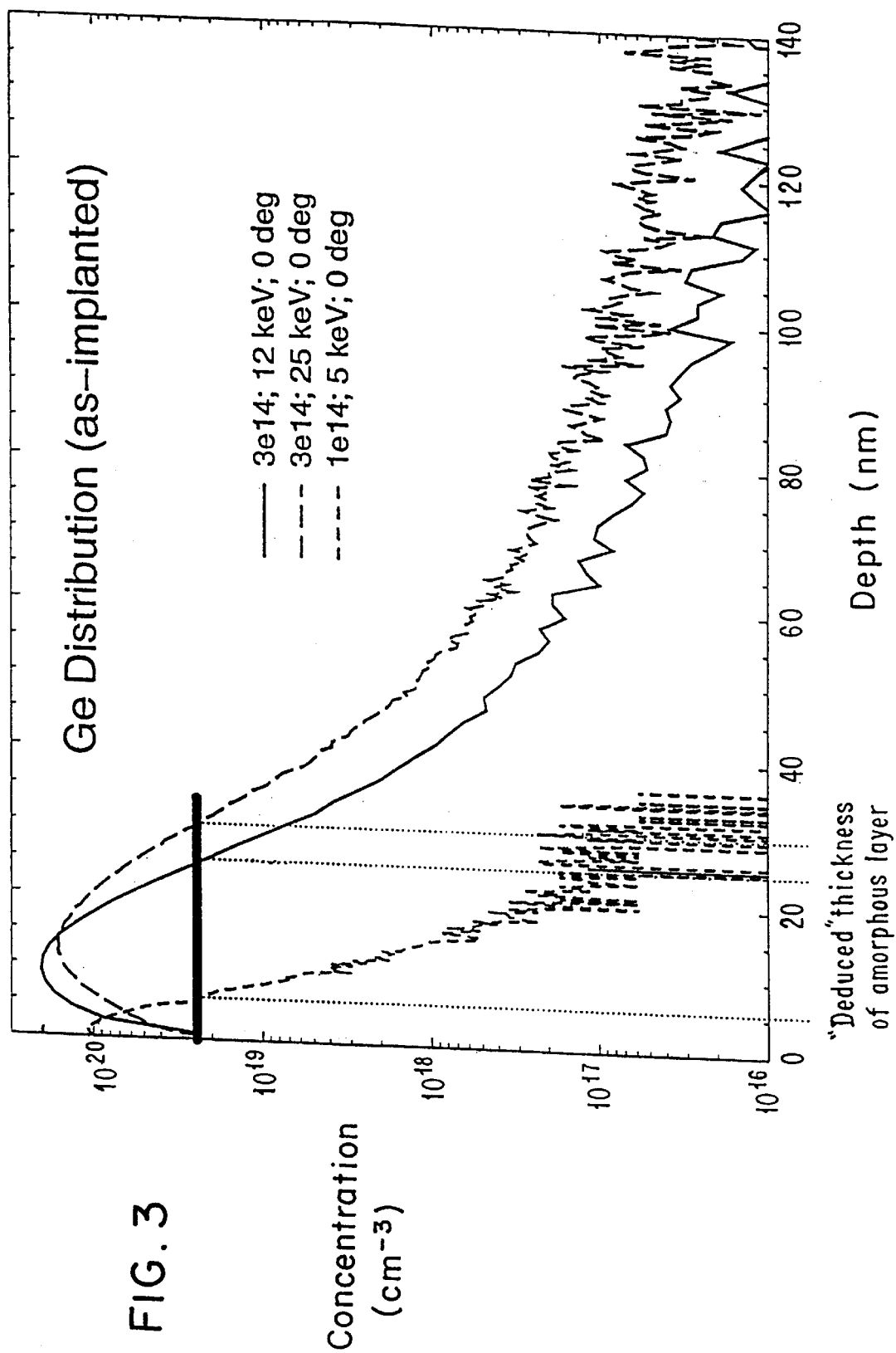
FIG. 3 is a graph showing Ge concentration vs. depth for different implant conditions and expected amorphous layer thickness.
Figure 4:
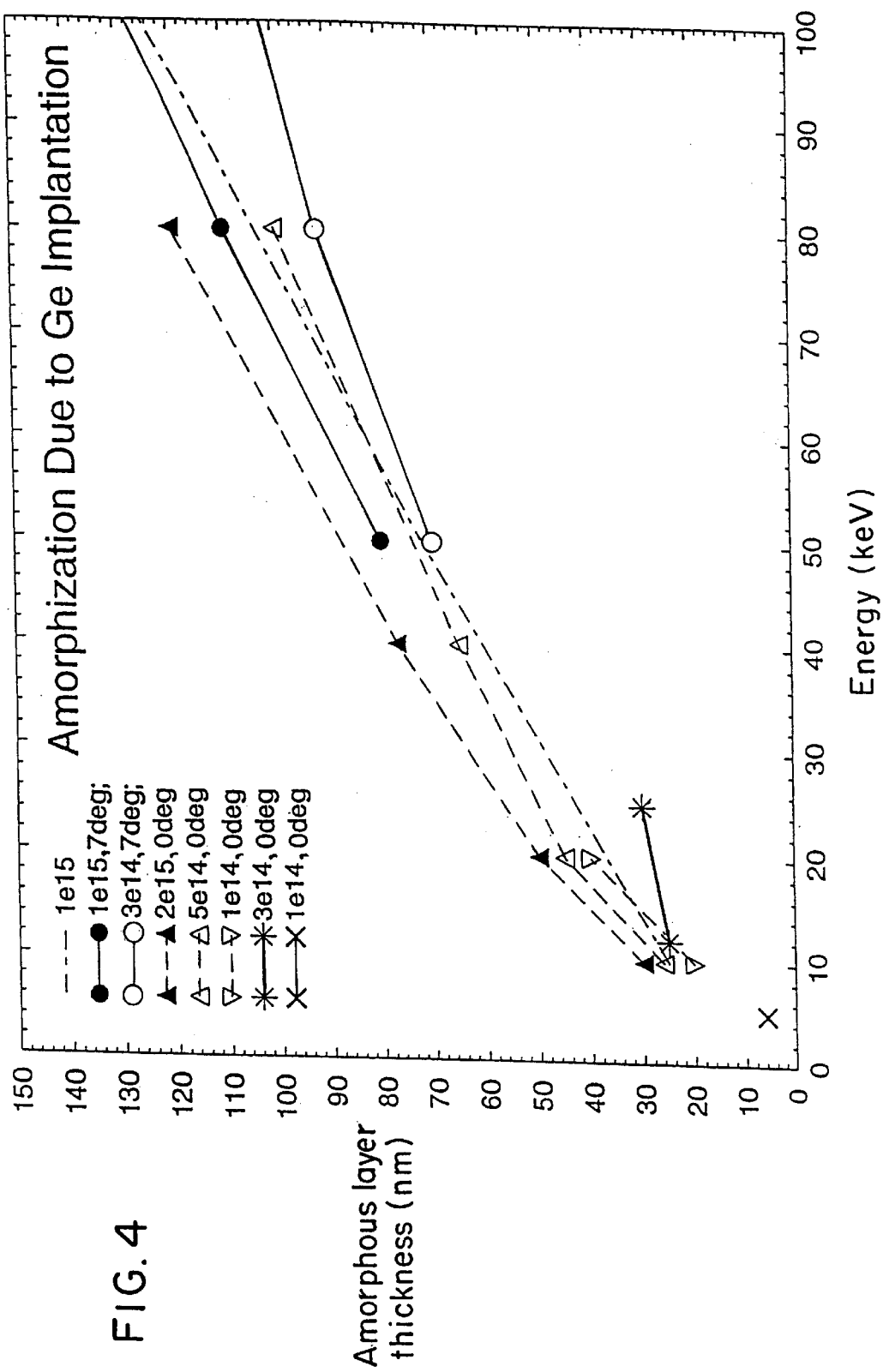
FIG. 4 is a graph showing amorphous layer thickness v. Ge implant energy.
Figure 5:
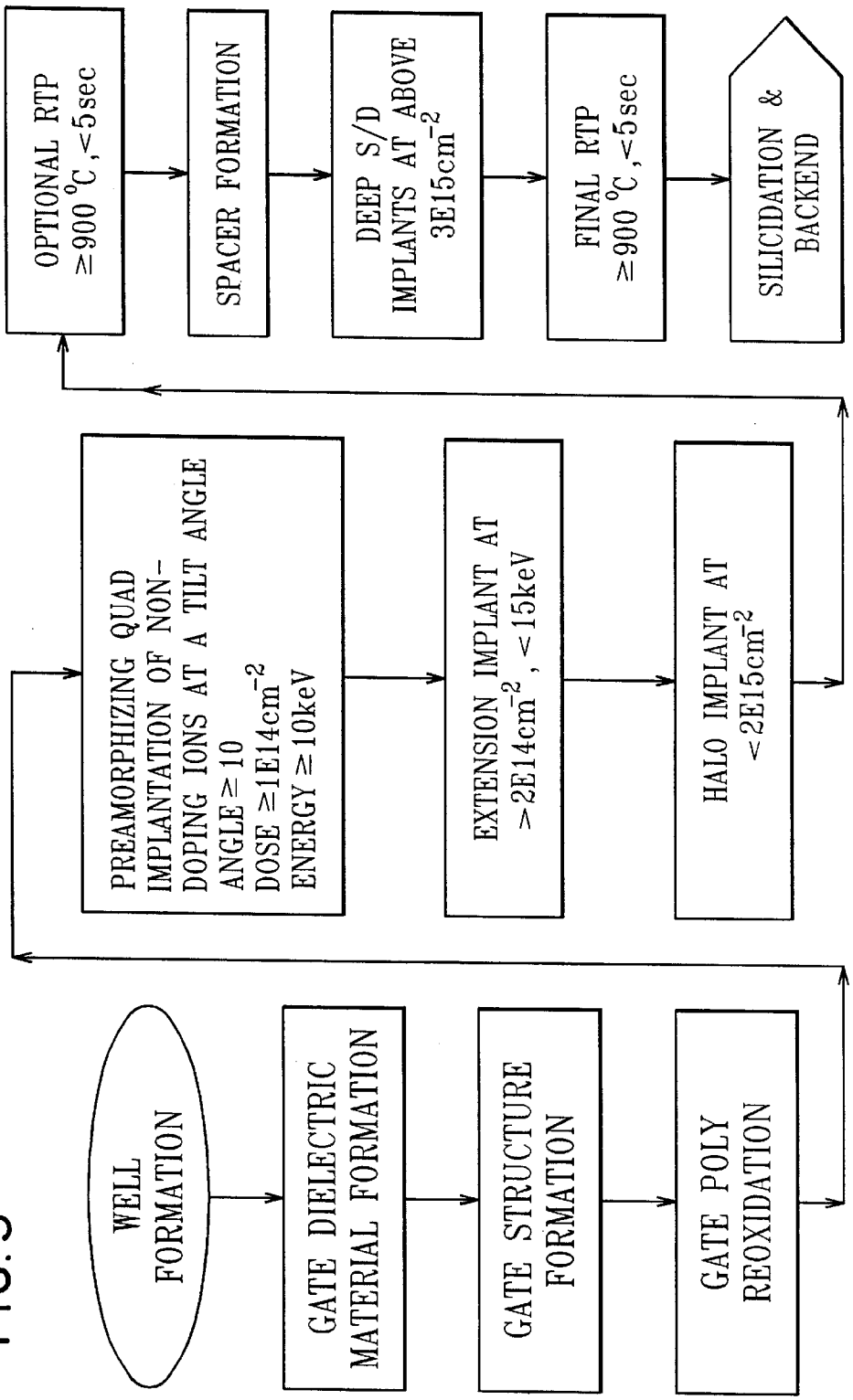
FIG. 5 is a flow chart illustrating a process sequence in accordance with the present invention.

FIGS. 3 and 4 illustrate the functional relationship of the amorphous layer thickness and different implant conditions. In particular, FIG. 3 is a graph of concentration of germanium vs. depth. FIG. 4 is a graph of amorphous layer thickness v. Ge implant energy.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for fabricating a semiconductor device which comprises providing a structure having a semiconductor substrate, gate insulating layer above selected portions of the semiconductor substrate, gate conductor located above the gate insulating layer; implanting into the substrate non-doping ions at a tilt angle α of at least about 10° and at least at a dosage of at least about 1E14 cm$^{-2}$, at an energy of about 10 keV, and wherein edges of the gate conductor act as a self-aligned mask for implanting the non-doping ions; and then implanting into the substrate dopants for providing source/drain extensions or halo doping or both.

2. The method of claim 1 wherein the non-doping ions are selected from the group consisting of germanium, silicon and mixtures thereof.

3. The method of claim 1 wherein the tilt angle α is about 10° to about 40°.

4. The method of claim 1 wherein the dopants are implanted at a dosage of greater than 2E14 cm$^{-2}$ and at an energy of less than 15 keV for providing source/drain extensions.

5. The method of claim 4 wherein dopants are implanted at a dosage of less than 2E15 cm$^{-2}$ to provide halo doping.

6. The method of claim 1 wherein dopants are implanted at a dosage of less than 2E15 cm$^{-2}$ to provide halo doping.

7. The method of claim 1 which further includes rapid thermal processing by subjecting the structure to a temperature of about 900 to about 1050° C. for 5 seconds or less after implanting the non-doping ions and the dopants.

8. The method of claim 1 which further comprises forming sidewall spacers on the gate conductor after implanting the non-doping ions and dopants.

9. The method of claim 8 which further comprises implanting dopants at a dosage of greater than 3E15 cm$^{-2}$ for providing deep source/drain after forming the sidewall spacers.

10. The method of claim 1 which further comprises implanting dopants at a dosage of greater than 3E15 cm$^{-2}$ for providing deep source/drain.

11. The method of claim 10 which further comprises a rapid temperature anneal employing a temperature of about 900 to about 1050° C. for less than 5 seconds after implanting the dopants for the deep source/drain regions.

12. The method of claim 1 which comprises implanting the non-doping ions at a dosage of about 1E14 cm$^{-2}$ to about 1E15 cm$^{-2}$ and an energy of about 10 to about 40 Kev.

13. The method of claim 1 which further comprises rotating the semiconductor device.

14. The method of claim 13 which further comprises rotating the device 90° after implanting one quarter of the total dosage of the non-doping ions, and repeating the 90° rotation and ¼ dosage implanting two more times for a total of rotating three times.

15. Semiconductor device obtained by the process of claim 1.

16. A semiconductor device which comprises a structure having a semiconductor substrate, gate insulating layer located above selected portions of the semiconductor substrate, gate conductor located above the gate insulating layer, wherein the substrate includes non-doping ions having been implanted at a tilt angle α of at least about 10° and at a dosage of at least about 1E14 cm$^{-2}$ at an energy of at least about 10 keV and wherein the substrate further includes dopants for providing source/drain extensions or halo doping or both.

17. The semiconductor device of claim 16 wherein the non-doping ions are selected from the group consisting of germanium, silicon and mixtures thereof.

18. The semiconductor device of claim 16 wherein the dopants for providing source/drain extensions are at a dosage of at least 2E14 cm$^{-2}$.

19. The semiconductor of claim 18 wherein the dopants for the halo doping are at a dosage of less than 2E15 cm$^{-2}$.

20. The semiconductor of claim 16 wherein the dopants for the halo doping are at a dosage of less than 2E15 cm$^{-2}$.

21. The semiconductor device of claim 16 which further includes sidewall spacers on the gate conductor.

22. The semiconductor device of claim 21 wherein the sidewall spacers comprise silicon dioxide, silicon nitride or both.

23. The semiconductor device of claim 16 which further includes deep source/drain implant regions.

24. The semiconductor device of claim 23 wherein the deep source/drain regions contain dopants at a dosage of about 3E15 cm$^{-2}$ and above.

25. The semiconductor device of claim 16 wherein the dosage is about 1E14 cm$^{-2}$ to about 1E15 cm$^{-2}$ and the energy is about 10 to about 40 keV.

26. A method for fabricating a semiconductor device which consists essentially of providing a structure having a semiconductor substrate, gate insulating layer above selected portions of the semiconductor substrate, gate conductor located above the gate insulating layer; implanting into the substrate non-doping ions at a tilt angle α of at least about 10° and at a dosage of at least about 1E14 cm$^{-2}$, at an energy of at least about 10 keV, and wherein edges of the gate conductor act as a self-aligned mask for implanting the non-doping ions; and then implanting into the substrate dopants for providing source/drain extensions or halo doping or both.

27. The method of claim 26 which further comprises forming sidewall spacers on the gate conductor after implanting the non-doping ions and dopants.

28. The method of claim 27 which further comprises implanting dopants at a dosage of greater than 3E15 cm$^{-2}$ for providing deep source/drain after forming the sidewall spacers.

29. The method of claim 28 which further comprises a rapid temperature anneal employing a temperature of about 900 to about 1050° C. for less than 5 seconds after implanting the dopants for the deep source/drain regions.

* * * * *